(12) United States Patent
Horiuchi et al.

(10) Patent No.: US 6,271,478 B1
(45) Date of Patent: Aug. 7, 2001

(54) MULTI-LAYER CIRCUIT BOARD

(75) Inventors: Michio Horiuchi; Yukiharu Takeuchi, both of Nagano; Chiaki Takubo, Tokyo, all of (JP)

(73) Assignee: Shinko Electric Industries Co., Ltd. (JP)

( * ) Notice: Subject to any disclaimer, the term of this patent is extended or adjusted under 35 U.S.C. 154(b) by 0 days.

(21) Appl. No.: 09/195,831

(22) Filed: Nov. 19, 1998

(30) Foreign Application Priority Data

Nov. 19, 1997 (JP) .................................................. 9-318313

(51) Int. Cl.[7] ...................................................... H05K 1/14
(52) U.S. Cl. ......................... 174/255; 174/260; 174/262; 257/700; 257/786; 361/760
(58) Field of Search .................................. 174/255, 260, 174/262, 263, 264; 257/700, 786; 361/760, 777

(56) References Cited

U.S. PATENT DOCUMENTS

| | | | |
|---|---|---|---|
| 4,202,007 | * 5/1980 | Dougherty et al. | 174/260 X |
| 5,467,252 | 11/1995 | Nomi et al. | 361/760 |
| 5,650,660 | 7/1997 | Barrow | 257/668 |
| 5,812,379 | 9/1998 | Barrow | 361/773 |
| 6,107,685 | * 8/2000 | Nishiyama | 257/786 X |

FOREIGN PATENT DOCUMENTS

| | | |
|---|---|---|
| 0 308 714 | 3/1989 | (EP) . |
| 0 351 184 | 1/1990 | (EP) . |
| 0 814 643 | 12/1997 | (EP) . |

* cited by examiner

Primary Examiner—Albert W. Paladini
(74) Attorney, Agent, or Firm—Pennie & Edmonds LLP

(57) ABSTRACT

A multi-layer circuit board having a decreased number of circuit boards for mounting an electronic part that has connection electrodes arranged in the form of an area array, featuring a high yield and improved reliability. In the multi-layer circuit board, circuit patterns formed on a first circuit board on the surface of the side where said electronic part is mounted, are connected to every land positioned on the outermost side of the lands arranged in the form of an area array, and are connected to the lands alternatingly selected from the lands of the second sequence and the third sequence of the inner side; circuit patterns formed on a second circuit board are connected to every via electrically connected to the lands of the second sequence to which the circuit pattern is not connected on the first circuit board, and to the vias electrically connected to all of the lands of the fourth sequence and the fifth sequence on the first circuit board; circuit patterns formed on a third circuit board are connected to every via electrically connected to the lands of the third sequence to which the circuit pattern is not connected on the first circuit board, and to the vias electrically connected to all of the lands of the sixth sequence and the seventh sequence on the first circuit board; and circuit patterns formed on a fourth circuit board are connected to every via electrically connected to the lands of the eighth sequence and the ninth sequence on the first circuit board.

2 Claims, 7 Drawing Sheets

MULTI-LAYER CIRCUIT BOARD

BACKGROUND OF THE INVENTION

1. Field of the Invention

The present invention relates to a multi-layer circuit board for mounting an electronic element such as a semiconductor chip having connection electrodes arranged in the form of an area array or a semiconductor device having external connection terminals arranged in the form of an area array, such as in a regular lattice form or in a regular staggered manner.

2. Description of the Prior Art

In modern semiconductor devices, the logic devices are becoming highly functional and highly integrated, feature more inputs and outputs, and are being mounted ever more densely. Therefore, products have been produced to compensate for a lack of space for forming electrodes by arranging electrodes as an area array on the electrode-forming surface of a semiconductor chip.

FIG. 11 illustrates an example in which a semiconductor chip 4 is mounted on a circuit board 5 relying on an ordinary flip-chip connection. The semiconductor chip 4 has electrodes 6 arranged on the peripheral edges thereof. Circuit patterns 7 are connected to every electrode 6 on a single plane.

FIG. 12 illustrates the arrangement of lands 8 on a circuit board for mounting a semiconductor chip, and the arrangement of circuit patterns 7 drawn from the lands 8. In this example, the lands 8 are arranged in two sequences, each circuit pattern 7 is drawn running between the lands; i.e., the circuit pattern 7 is drawn from every land 8 on a single surface.

When the electrodes are arranged in many sequences in the longitudinal and transverse directions on the electrode-forming surface, however, it becomes no longer possible to take out the wirings toward the outer side from every land on the surface though it may vary depending upon the distance between the lands and the number of the lands.

In order to solve this problem, a method has been proposed according to which the circuit board for mounting a semiconductor chip is formed in many layers, and circuit patterns of the laminated circuit boards are suitably arranged to electrically connect all electrodes of the semiconductor chip to the circuit patterns. FIG. 13 illustrates an example where a semiconductor chip 4, on which the electrodes 6 are arranged as an area array, is mounted on a multi-layer circuit board. By using this multi-layer circuit board, it is possible to electrically connect every electrode 6 to the circuit patterns 7, 7a even though the semiconductor chip 4 has electrodes 6 arranged as an area array. In FIG. 13, reference numeral 7a denotes a circuit pattern of an inner layer, 5a to 5d denote first to fourth circuit boards, and reference numeral 9 denotes external connection terminals.

When the semiconductor chip having electrodes arranged as an area array is to be mounted on the circuit board, only about two circuit boards must be laminated one upon the other provided the number of the electrodes is not very large. However when the semiconductor chip has as may pins as, for example, 30×30 pins or 40×40 pins, six to ten circuit boards must be laminated one upon the other.

When a plurality of circuit boards, on which the circuit patterns are very densely formed, are to be laminated to make a multi-layer circuit board, there will be employed a high-density wiring method such as build-up method. However, these methods have serious problems in regard to yield of the products, reliability and the cost of production. That is, when many circuit boards are to be laminated one upon the other, the boards should be successively laminated in such a manner that electrical connection must be accomplished through the vias formed in each board between the circuit patterns and between the circuit patterns across the boards. Therefore, a high degree of precision would be required. However, at present, such methods do not offer a high degree of reliability. Furthermore, when many boards are laminated, it is required that none of the boards is defective, involving a further increased technical difficulty.

SUMMARY OF THE INVENTION

To produce a multi-layer circuit board maintaining a good yield, therefore, a reduction in the number of wiring layers would be an effective solution.

The present invention is concerned with a multi-layer circuit board for mounting an electronic part such as a semiconductor chip, having as many as 40×40 pins arranged in the form of an area array, on the side of the mounting surface, or such as a semiconductor device having electrodes arranged in the form of an area array, on the side of the mounting surface.

Thus an object of the present invention is to provide a multi-layer circuit board for mounting such a semiconductor chip or a semiconductor device, despite a decreased number of circuit boards being laminated one upon the other, which features an improved yield of production of the multi-layer circuit board and which can be used as a highly reliable product.

The present invention provides a multi-layer circuit board formed by laminating a plurality of circuit boards each having:

lands and/or vias arranged in many number in the form of an area array on a surface of the side on which an electronic part is mounted; and circuit patterns having the ends on one side thereof connected to said lands and/or vias and having the ends, on the other side thereof, that are drawn from a region where said lands and/or vias are arranged in the form of an area array under such a condition that four or more circuit patterns are passed between the lands and/or vias at both ends by removing an intermediate land and/or via from the consecutively arranged three lands and/or vias; wherein circuit patterns formed on a first circuit board on the surface of the side where said electronic part is mounted, are connected to every land positioned on the outermost side of the lands arranged in the form of an area array, and are connected to the lands alternatingly selected from the lands of the second sequence and the third sequence of the inner side;

circuit patterns formed on a second circuit board are connected to every via electrically connected to the lands of the second sequence to which the circuit pattern is not connected on the first circuit board, and to the vias electrically connected to all of the lands of the fourth sequence and the fifth sequence on the first circuit board;

circuit patterns formed on a third circuit board are connected to every via electrically connected to the lands of the third sequence to which the circuit pattern is not connected on the first circuit board, and to the vias electrically connected to all of the lands of the sixth sequence and the seventh sequence on the first circuit board; and circuit patterns formed on a fourth circuit board are connected to every via electrically connected to the lands of the eighth sequence and the ninth sequence on the first circuit board.

The invention further provides a multi-layer circuit board formed by laminating, in many layers, the circuit boards having circuit patterns arranged in the same manner as the circuit patterns formed on said first to third circuit boards repetitively and in the same manner as said first to third circuit boards, and further laminating a circuit board having circuit patterns arranged in the same manner as the circuit patterns on said fourth circuit board.

DETAILED DESCRIPTION OF THE INVENTION

Figure 1:
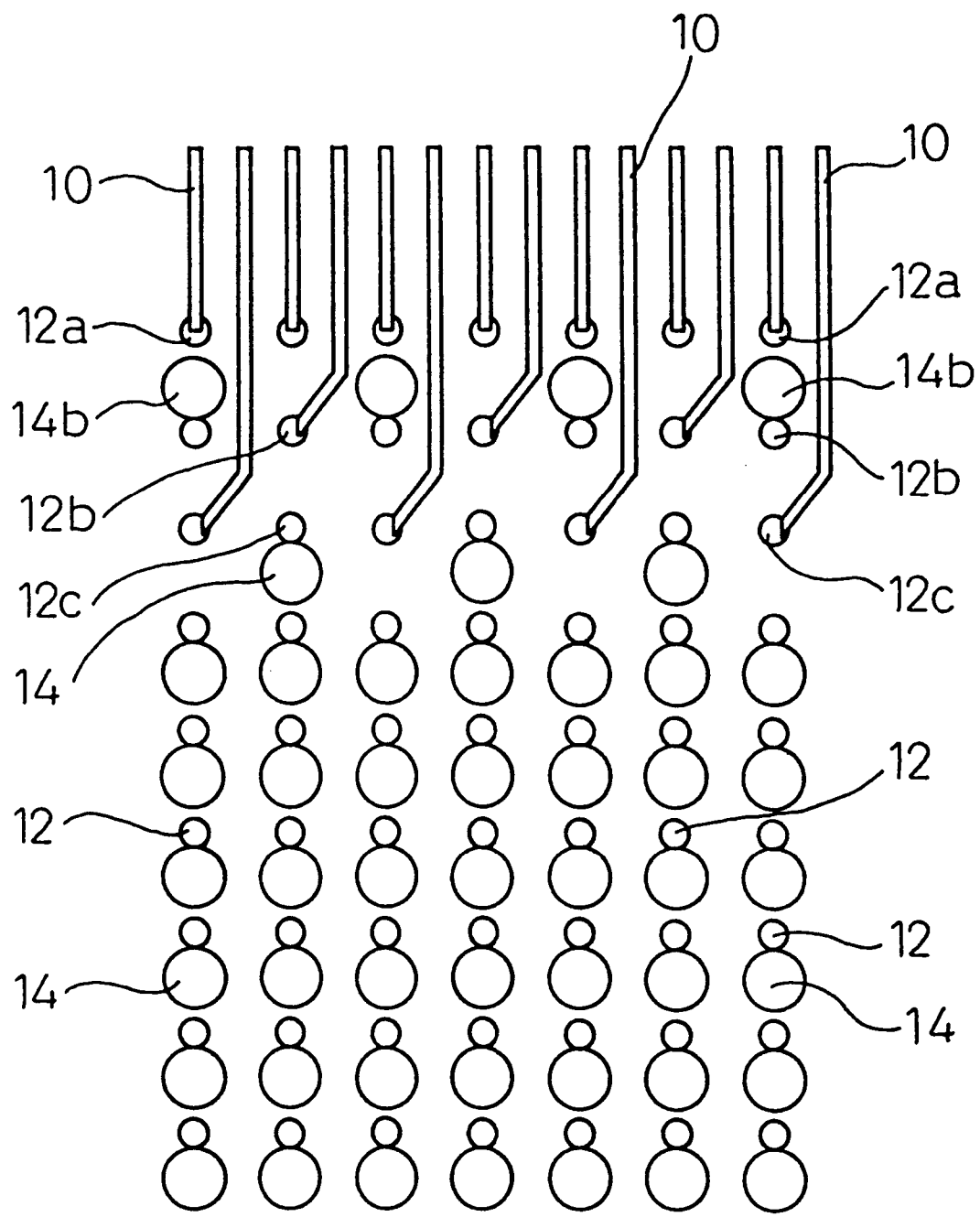
FIG. 1 is a view illustrating, on a plane, an arrangement of circuit patterns on a first circuit board in a multi-layer circuit board according to an embodiment of the present invention.

A multi-layer circuit board according to an embodiment of the present invention will now be described in detail with reference to the accompanying drawings.

The multi-layer circuit board according to the present invention is intended to decrease the number of the circuit boards for mounting an electronic part having many electrodes arranged in the form of an area array by contriving an arrangement of circuit patterns on each circuit board that constitutes the multi-layer circuit board, and to facilitate the fabrication of the multi-layer circuit board. Arrangement of the circuit patterns provided on each circuit board will now be concretely described.

The electronic part stands for a semiconductor chip or a semiconductor device mounting thereon a semiconductor chip, each having electrodes or external connection terminals arranged in the form of an "area array". The circuit patterns are those that are each connected at one end on one side to an electrode or to an external connection terminal of the part, and are each drawn outward at the other end on the other side from a region where the external electrode or connection terminal is arranged.

In the multi-layer circuit board according to the present invention, a condition of drawing or arranging the circuit patterns returns to the initial state with the four circuit boards as a unit. Therefore, the following description deals with the constitution of the fourth circuit board in which the drawing of circuit patterns turns once. The same idea, however, can be similarly adapted to the case where the multi-layer circuit board is constituted of five or more circuit boards.

FIGS. 1 to 4 illustrate the arrangements of circuit patterns on the first to fourth circuit boards, and FIGS. 5 to 8 illustrate, in cross section, the circuit patterns on these circuit boards.

Figure 10:
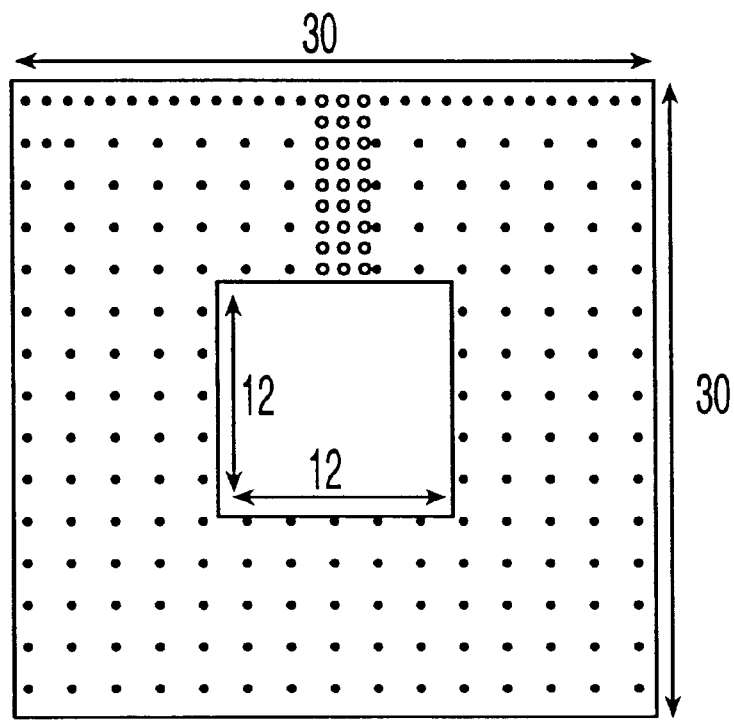
FIG. 10 is a view illustrating the arrangement of connection portions of an electronic part such as a semiconductor chip.
Figure 11:
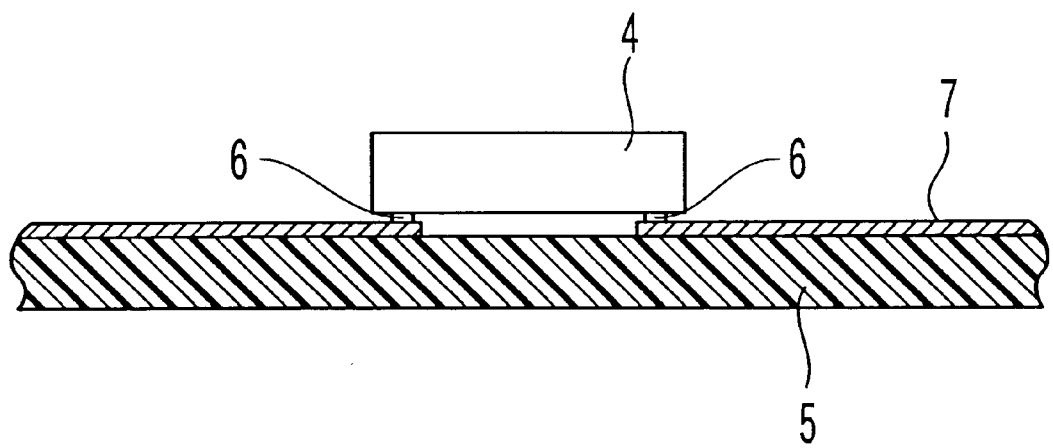
FIG. 11 is a view illustrating a method of mounting a semiconductor chip according to the flip-chip connection.
Figure 12:
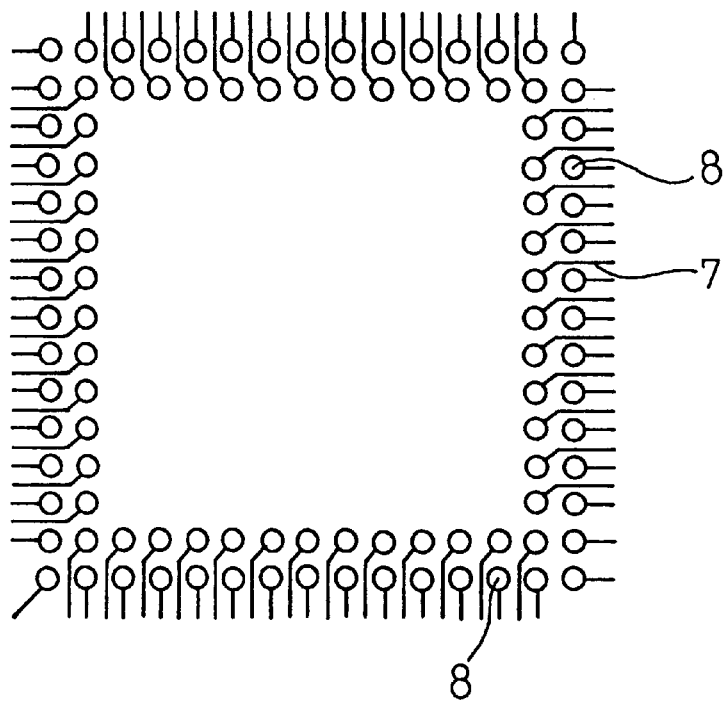
FIG. 12 is a view illustrating a conventional example in which circuit patterns are connected to the lands.
Figure 13:
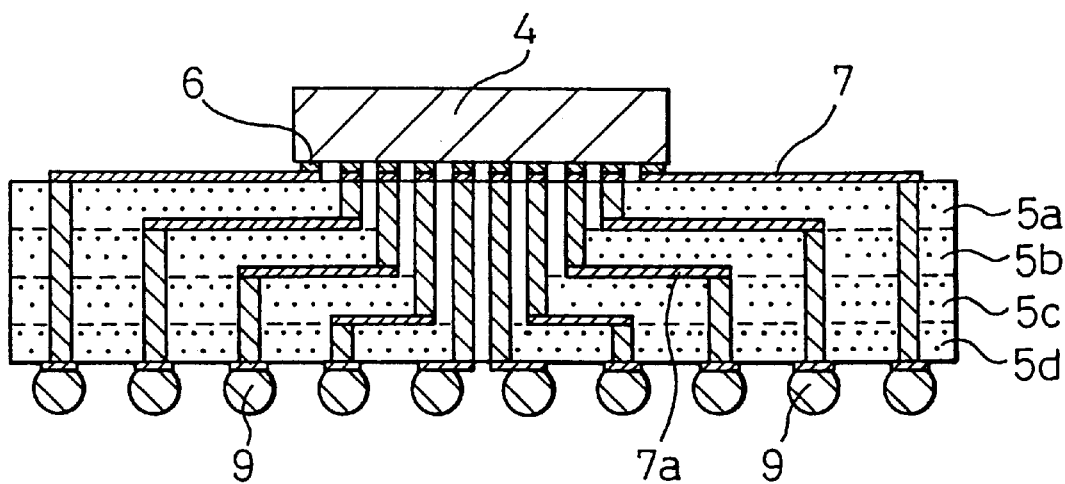
FIG. 13 is a sectional view illustrating a conventional state where a semiconductor chip is mounted on a multi-layer circuit board.

FIG. 1 illustrates the arrangement (drawing method) of circuit patterns 10 formed on a first circuit board in the multi-layer circuit board. The multi-layer circuit board of this embodiment mounts an electronic part having connection portions such as electrodes arranged in the form of a lattice. On the first circuit board are arranged lands 12, in the form of a lattice, to meet the pitch of arrangement of the connection portions. Referring to FIG. 10, connection portions such as electrodes are arranged in a predetermined number of rows and in a predetermined number of columns on the mounting surface of an article that is mounted such as a semiconductor chip. On the first circuit board of the multi-layer circuit board are formed the lands 12 maintaining the same arrangement as that of these connection portions. FIG. 1 illustrates part of the region where the lands 12 are arranged.

In FIG. 1, reference numeral 14 denotes positions for arranging the vias through which the lands 12 of the first circuit board are electrically connected to the circuit patterns 10 of the second circuit board or the third and fourth circuit boards.

Depending upon the method of production, the vias are formed in the multi-layer circuit board at positions the same as the lands 12 or at positions laterally deviated from the positions of the lands 12 as shown. There is no need of forming vias 14 for the lands 12 to which the circuit patterns 10 have been connected already on the first circuit board. Therefore, the positions for arranging the vias 14 are not shown for such lands 12.

The arrangement of circuit patterns 10 on the first circuit board shown in FIG. 1 has the feature that the circuit patterns 10 are connected to every land 12a of the outermost circumference (lands of the first sequence) among the lands arranged in the form of an area array, and the circuit patterns 10 are alternatingly drawn from the lands 12b of the second sequence which are on the inside and from the lands 12c of the third sequence which are further on the inside thereof. The circuit patterns 10 are drawn from the lands 12b, 12c of the second and third sequences passing among the neighboring lands in the same manner as the conventional method.

By alternatingly drawing the circuit patterns 10 from the lands 12b of the second sequence and from the lands 2c of the third sequence, as described above, there are left every other land 12b, 12c on the sequences where the lands 12b of the second sequence and the lands 12c of the third sequence are arranged. The remaining lands 12b and 12c are electrically connected to the next circuit board through the vias 14. The vias 14b connected to the lands 12b are arranged being deviated toward the outer side relative to the lands 12b contrary to the arrangement of other vias 14. This is to impart a margin for the arrangement of circuit patterns 10 that are arranged on the second and subsequent circuit boards.

Figure 5:
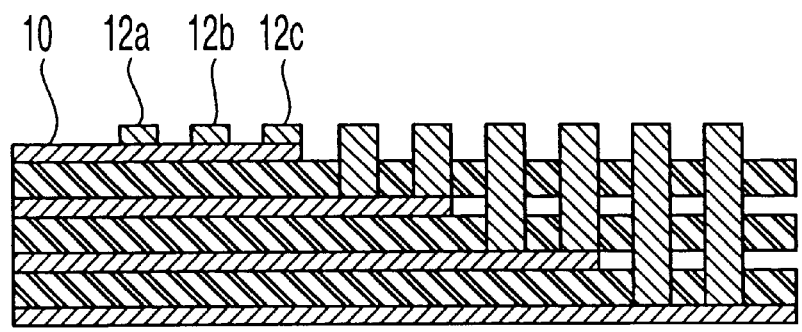
FIGS. 5 to 8 are sectional views, respectively illustrating the arrangement of the circuit patterns of the first to fourth circuit boards according to the embodiment.

FIG. 5 illustrates the arrangement of the circuit patterns 10 on the first circuit board as viewed from a direction of cross section of the multi-layer circuit board. On the first circuit board, the circuit patterns 10 are connected to the lands 12 of the outermost side, to the lands 12 of the second sequence and to the lands 12 of the third sequence on the inside thereof.

Figure 2:
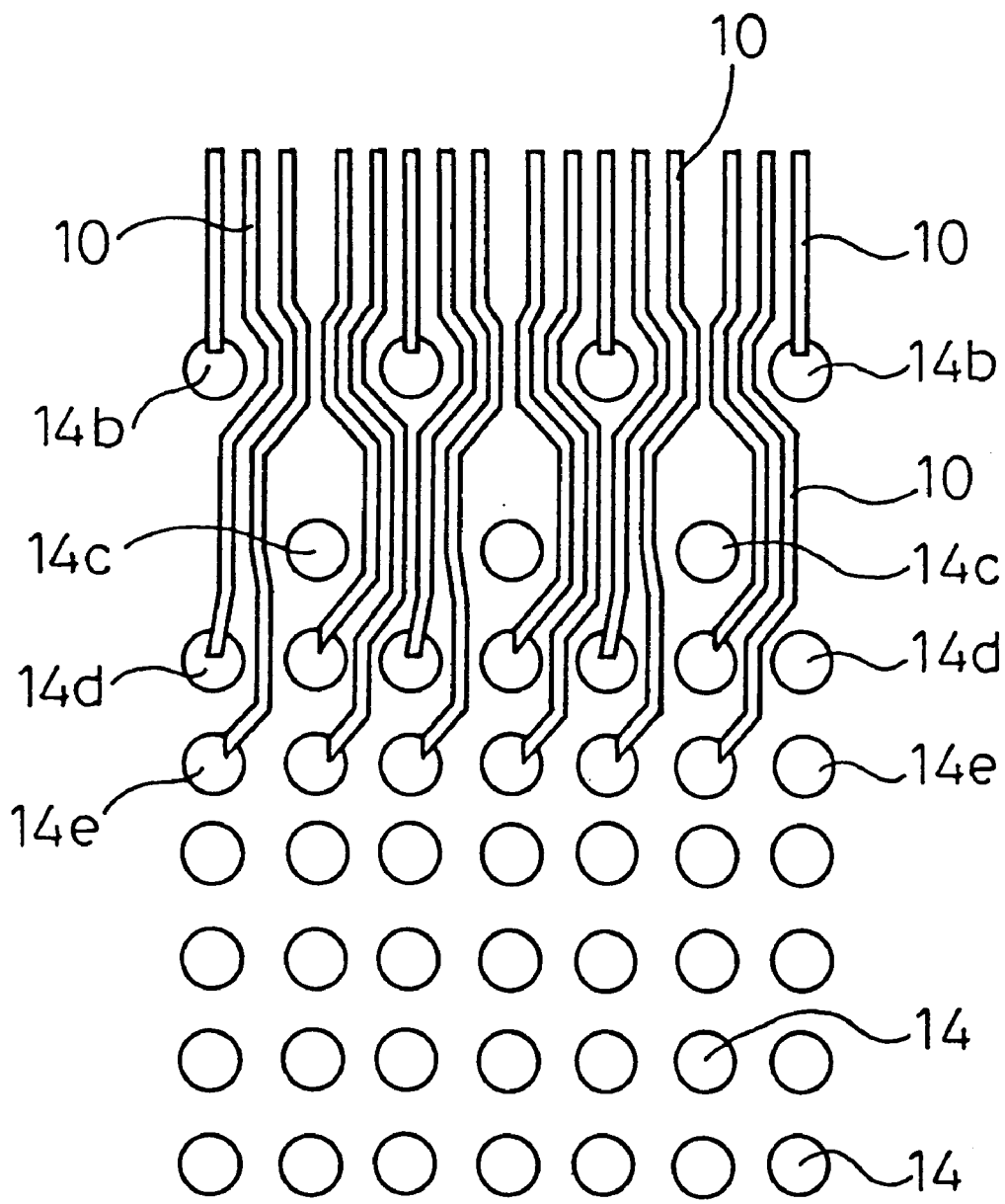
FIGS. 2 to 4 are views, respectively illustrating, on a plane, the arrangements of circuit patterns of the second to fourth circuit boards according to the embodiment.

FIG. 2 illustrates the arrangement of circuit patterns 10 formed on a second circuit board in the multi-layer circuit board. On the second circuit board, the circuit patterns 10 are drawn from lands other than those from which the patterns 10 are drawn on the first circuit board. The second and subsequent circuit boards are electrically connected to the lands 12 of the first circuit board through the vias 14. In the second and subsequent circuit boards, therefore, the vias 14 and the circuit patterns 10 are connected together. Therefore, the drawing illustrates a state where the vias 14 and the circuit patterns 10 are connected together.

On the second circuit board, there are formed vias 14b and 14c that are electrically connected to the lands 12b, 12c to which no circuit pattern 10 has been connected on the first circuit board, and vias 14 that are electrically connected to the remaining lands 12 on the first circuit board.

The arrangement of circuit patterns 10 on the second circuit board has a feature in that the circuit patterns 10 are drawn from the vias 14b connected to the lands 12b of the second sequence, but no circuit pattern 10 is connected to the vias 14c connected to the lands 12 of the third sequence, and the circuit patterns 10 are connected to the vias 14d, 14e connected to the lands of the fourth sequence and the fifth sequence which are further toward the inner side.

The vias 14b corresponding to the lands 12b of the second sequence are located on the outermost side on the second circuit board. Therefore, no limitation is imposed on connecting the circuit patterns 10 on these vias 14b. On the second circuit board as described above, the circuit patterns 10 are connected to the vias 14d and 14e of the fourth sequence and the fifth sequence. Here, as shown, a feature resides in that the circuit patterns 10 are connected to every via 14d of the fourth sequence and to every via 14e of the fifth sequence.

Figure 6:
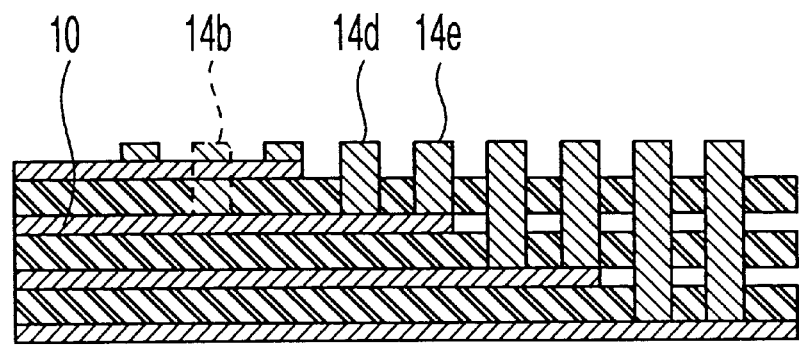

FIG. 6 illustrates the fact that, on the second circuit board, the circuit patterns 10 are electrically connected to the lands through the vias 14d and 14e, and the circuit patterns 10 are electrically connected to the remaining lands on the first circuit board through the vias 14b.

As described above, the circuit patterns 10 are connected to every via 14d, 14e of the fourth sequence and the fifth sequence, owing to the fact that the circuit patterns 10 are alternatingly connected to the lands 12b, 12c of the second sequence and the third sequence at the time of arranging the circuit patterns 10 on the first circuit board. That is, the fact that the lands 12b and 12c are alternatingly left means that vacant spaces are alternatingly maintained due to the removal of the lands 12b and 12c in the second sequences and in the third sequence.

In designing the circuit patterns 10 on a circuit board constituting the multi-layer circuit board, how many circuit patterns 10 can be passed within a predetermined space serves as a reference for judging whether the number of the circuit boards of the multi-layer circuit board can be effectively decreased or not. In this embodiment, the lands 12b, 12c of the second sequence and the third sequence are alternatingly selected on the first circuit board to secure empty space for passing the circuit patterns 10, so that the circuit patterns 10 can be efficiently arranged.

The width of the circuit patterns, the gap among the circuit patterns, the diameter of the lands and the pitch among the lands have been determined in advance depending upon the products, and the circuit patterns are designed so as to be drawn running among the lands under these conditions.

In a simple form of arranging circuit patterns, only one circuit pattern may be passed between the lands. In this case, whether particular lands are better removed or not, is determined depending upon whether the number of the circuit patterns can be increased to be larger than the originally designed number of the circuit patterns as a result of removing the lands. When an increased number of circuit patterns can be passed as a result of removing the particular lands, the device is so designed as to suitably remove the lands, so that the number of the circuit boards forming the multi-layer circuit board can be decreased.

Figure 9A:
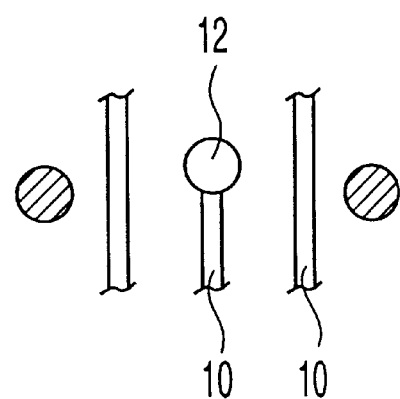
FIGS. 9(a) and 9(b) are diagrams illustrating the arrangement of circuit patterns in which the land is removed.
Figure 9B:
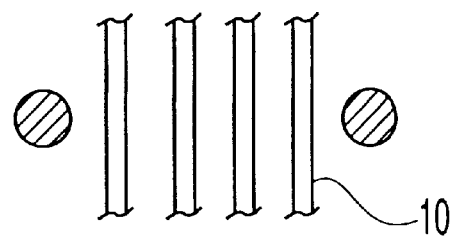

FIGS. 9(a) and 9(b) illustrate a simple example where the circuit patterns 10 are arranged. FIG. 9(a) illustrates the case where the land 12 exists in an intermediate position permitting three circuit patterns 10 to be drawn. FIG. 9(b) illustrates the case where the intermediate land 12 is removed permitting four circuit patterns 10 to be drawn. Thus, when the circuit patterns 10 can be drawn in a number larger than that initially intended as a result of removing the lands 12, then, the removal the lands 12 is effective in decreasing the number of the circuit boards of the multi-layer circuit board.

In the multi-layer circuit board of this embodiment, an intermediate land 12 is removed among the three lands 12, enabling four circuit patterns 10 to be drawn between the lands 12. As shown in FIG. 2, therefore, the circuit patterns 10 can be connected to all of the vias 14d, 14e of the fourth sequence and the fifth sequence.

In general, when the lands are arranged in a number of "n" maintaining an equal distance, and when the intermediate lands of the number of "(n−2)" do not exist except the lands at the two extreme ends, then, the number "m" of the lines that can be passed (arranged) through between the lands at the two extreme ends, excluding the lines of the lands at the extreme ends, is given by the formula, $$m = \{(\text{land pitch}) \times (n-1) - (\text{land diameter}) - (\text{space between patterns})\} \div (\text{pattern width}) + (\text{space between parameters})$$

where "land pitch" is a distance between the centers of the lands, "land diameter" is a diameter of the land, and "space between patterns" is a minimum distance that must be maintained between the neighboring circuit patterns.

If it is considered that only one circuit pattern is allowed to pass through between the neighboring lands, then, the number "k" of circuit patterns that can be arranged between the lands at two ends is given by, $$k = (n-1) + (n-2) = 2n-3$$

This means that there are "(n−1)" channels that permit the passage of circuit patterns among the lands of a number of "n", that there are intermediate lands of a number of "(n−2)" excluding the lands at both ends, and that a circuit pattern can be drawn from each of these lands.

Upon comparing "m" with "(k+1)", therefore, when m<(k+1), there is obtained no effect for increasing the circuit patterns even if the intermediate lands are all removed among the lands of a number of "n". When m≧(k+1), on the other hand, there is obtained the effect for increasing the circuit patterns when the intermediate lands are removed.

In order to constitute a multi-layer circuit board using circuit boards in as small a number as possible, therefore, a minimum integer "n" that gives m≧(k+1) is selected as a parameter, and the circuit patterns are arranged according to the value "n".

Figure 3:
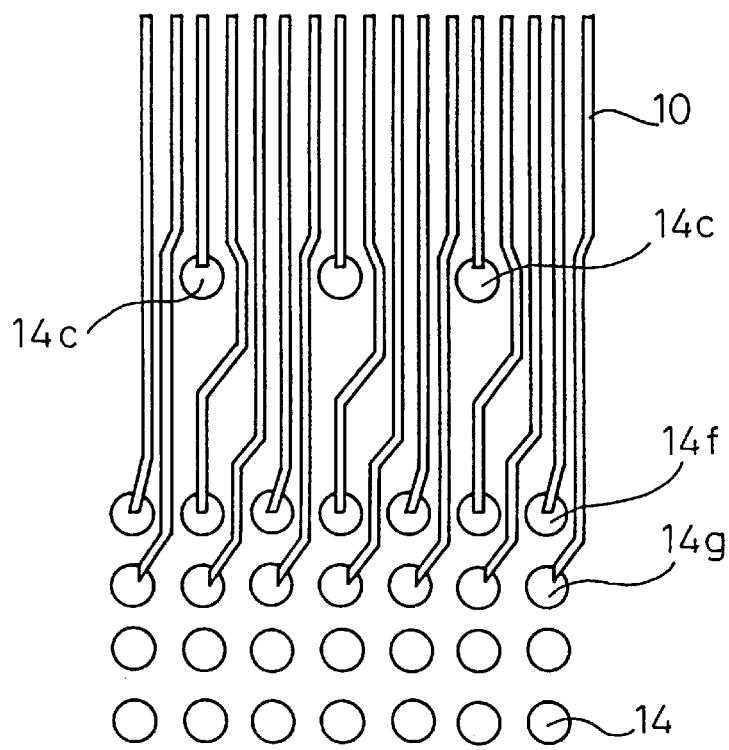

FIG. 3 illustrates the arrangement of circuit patterns 10 on the third circuit board. On the third circuit board, the circuit patterns 10 are connected to the vias 14c electrically connected to the lands 12c of the third sequence that are left on the first circuit board, and to the vias 14*f*, 14*g* of the sixth sequence and the seventh sequence. Since the vias 14*c* are positioned on the outermost side, no limitation is imposed on connecting the circuit patterns 10 to these vias 14*c*. As for the vias 14*f*, 14*g* of the sixth sequence and the seventh sequence, the circuit patterns 10 can be connected to all of the vias 14*f*, 14*g* like those of the second circuit board. That is, by contriving the arrangement of the circuit patterns 10 on the second circuit board, no limitation is imposed on drawing the circuit patterns 10 from the vias 14*b*, 14*d*, 14*e* located on the outer side of the vias 14*f*, 14*g*.

Figure 7:
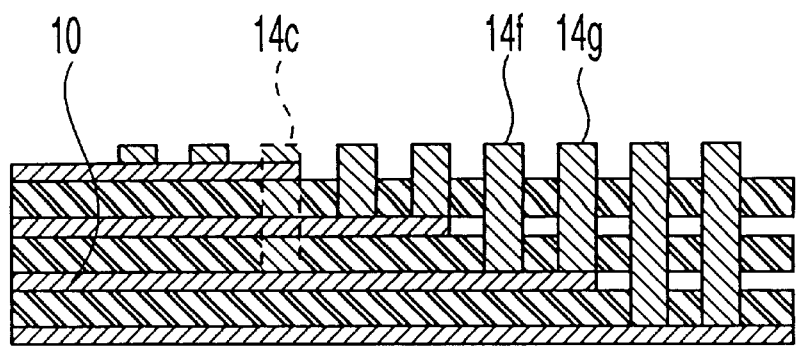

FIG. 7 illustrates the case where the circuit patterns 10 are connected to the vias 14*f*, 14*g* of the sixth sequence and the seventh sequence on the third circuit board, and the circuit patterns 10 are electrically connected, through the vias 14*c*, to the lands 12*c* left on the first circuit board.

Figure 4:
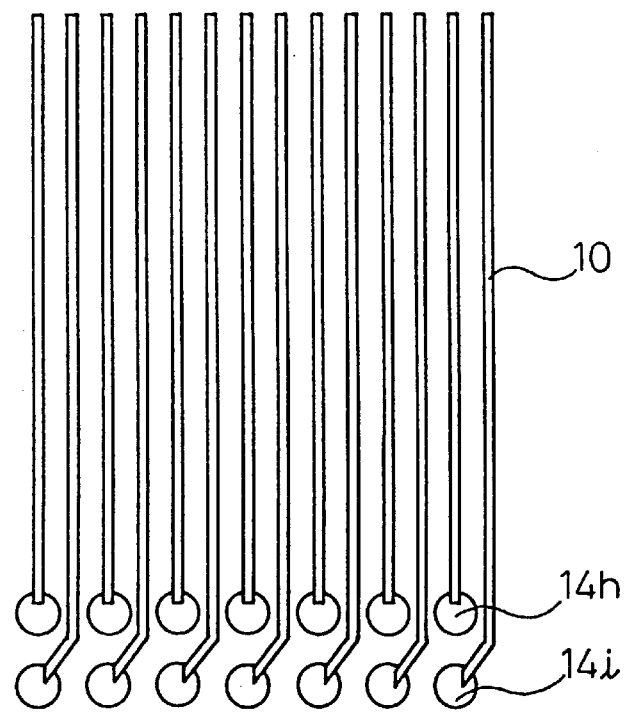

FIG. 4 illustrates the arrangement of circuit patterns 10 on the fourth circuit board. On the fourth circuit board, there are left only the vias 14*h*, 14*i* of he eighth sequence and the ninth sequence of the inner circumferences. Therefore, the circuit patterns 10 can be connected to all of the vias 14*h*, 14*i* according to an ordinary method of arrangement.

Figure 8:
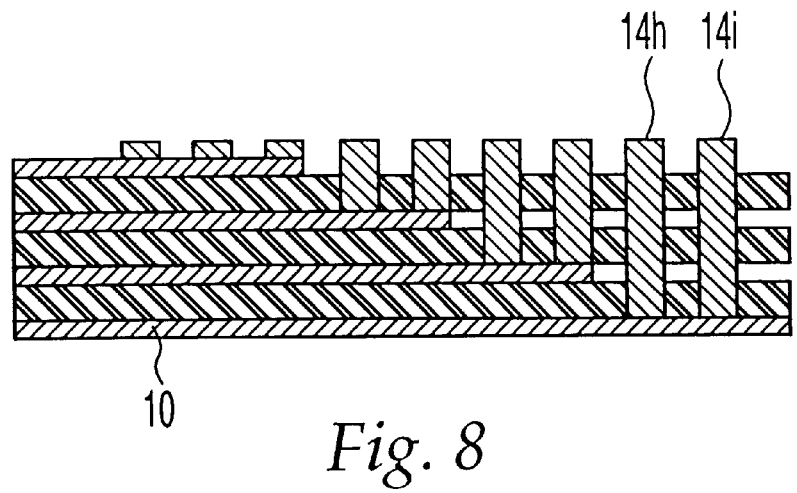

FIG. 8 illustrates the case where the vias 14*h*, 14*i* are connected to the circuit patterns 10, and the lands 12 of the first circuit board are electrically connected to the circuit patterns 10 through the vias 14*h*, 14*i*.

As described above, on the fourth circuit board, the outermost lands 12 are arranged in line, i.e., are assumed to be the initial state. This state is the same as the one where the circuit patterns 10 are newly drawn from the lands 12 arranged in the form of an area array. When the lands 12 are further arranged on the inner side, the circuit patterns 10 are arranged for the lands of the inner side in the same manner as in the above-mentioned embodiment. For the fourth circuit board, for example, the circuit patterns 10 are arranged quite in the same manner as on the first circuit board. For the fifth circuit board, the circuit patterns 10 are arranged quite in the same manner as the circuit patterns 10 on the second circuit board.

According to the multi-layer circuit board of the present invention as described above, the arrangements of the circuit patterns 10 are repeated every after three circuit boards in order to finally form a multi-layer structure.

when the number of lands arranged in the form of an area array is not large, however, the circuit patterns can be connected to all of the lands up to the fourth circuit board. That is, when the number of lands is in nine sequences, as will be understood from the description with reference to FIGS. 1 to 4, the circuit patterns can be connected to every land on the fourth circuit board. In the case of a product in which the electrodes (lands) are arranged on a region of a square shape excluding the portion where 30×30 pins are arranged on the outer side and 12×12 pins are arranged on the inner side, the circuit patterns can be connected to every land using the above-mentioned four-circuit board structure.

As described above, the multi-layer circuit board according to the present invention can be particularly effectively utilized for a device that is mounted having the number of lands that are not larger than nine sequences.

In the multi-layer circuit board of the present invention, furthermore, the circuit patterns 10 are successively drawn from the outer side, offering an advantage in that the order of drawing does not greatly change.

Moreover, the number of the circuit boards can be decreased relying upon a relatively simple method of arranging the circuit patterns 10, making it possible to easily fabricate a multi-layer circuit board maintaining an improved yield suppressing the cost of production, and, hence, to produce a highly reliable multi-layer circuit board within a short period of due time.

What is claimed is:

1. A multi-layer circuit board formed by laminating a plurality of circuit boards, each circuit board comprising a substrate having its surface, a plurality of lands or vias and circuit patterns formed on said surface of the substrate, each of said circuit patterns having one end connected to said land or via and the other end extending outwardly from a land area where said plurality of lands or vias are arranged under such a condition that at least one circuit pattern can pass through a first space between two adjacent lands or vias and at least four circuit patterns can pass through a second space between lands or vias at both ends by removing an intermediate one from consecutively arranged three lands or vias;

a first of said circuit boards having a plurality of said lands or vias arranged equidistantly in column and row directions to form an area array corresponding to an arrangement of electrodes of an electronic part which is to be mounted on said circuit board so that said electrodes are electrically connected to said respective lands or vias;

said first circuit board comprising said circuit patterns which are connected to all the lands or vias positioned on a first, outermost row of the area array, and are connected to alternatively selected lands or vias positioned on second and third rows;

a second of said circuit boards having a plurality of said lands or vias arranged so as to correspond to said lands or vias of the first circuit board to which no circuit patterns on the first circuit board are connected;

said second circuit board comprising said circuit patterns which are connected to all the lands or vias positioned on the second row, corresponding to said lands or vias of the first circuit board, to which no circuit patterns on the first circuit board are connected, and are connected to all the lands or vias positioned on forth and fifth rows;

a third of said circuit boards having a plurality of said lands or vias arranged so as to correspond to said lands or vias of the second circuit board to which no circuit patterns on the second circuit board are connected;

said third circuit board comprising said circuit patterns which are connected to all the lands or vias positioned on the third row, corresponding to said lands or vias of the second circuit board, to which no circuit patterns on the second circuit board are connected, and are connected to all the lands or vias positioned on sixth and seventh rows; and a fourth of said circuit boards having a plurality of said lands or vias arranged so as to correspond to said lands or vias of the third circuit board to which no circuit patterns on the third circuit board are connected;

said fourth circuit board comprising said circuit patterns which are connected to all the lands or vias positioned on eighth and ninth rows.

2. A multi-layer circuit board formed by laminating at least seven circuit boards, each circuit board comprising a substrate having its surface, a plurality of lands or vias and circuit patterns formed on said surface of the substrate, each of said circuit patterns having one end connected to said land or via and the other end extending outwardly from a land area where said plurality of lands or vias are arranged under such a condition that at least one circuit pattern can pass through a first space between two adjacent lands or vias and at least four circuit patterns can pass through a second space between lands or vias at both ends by removing an intermediate one from consecutively arranged three lands or vias; said multi-layer circuit board comprising:

first to third circuit boards comprising a first circuit board having a plurality of said lands or vias arranged equidistantly in column and row directions to form an area array corresponding to an arrangement of electrodes of an electronic part which is to be mounted on said circuit board so that said electrodes are electrically connected to said respective lands or vias;

said first circuit board comprising said circuit patterns which are connected to all the lands or vias positioned on a first, outermost row of the area array of the first circuit board, and are connected to alternatively selected lands or vias positioned on second and third rows of the first circuit board;

a second circuit board having a plurality of said lands or vias arranged so as to correspond to said lands or vias of the first circuit board to which no circuit patterns on the first circuit board are connected;

said second circuit board comprising said circuit patterns which are connected to all the lands or vias positioned on the second row of the second circuit board, corresponding to said lands or vias of the first circuit board, to which no circuit patterns on the first circuit board are connected, and are connected to all the lands or vias positioned on forth and fifth rows of the second circuit board;

a third circuit board having a plurality of said lands or vias arranged so as to correspond to said lands or vias of the second circuit board to which no circuit patterns on the second circuit board are connected;

said third circuit board comprising said circuit patterns which are connected to all the lands or vias positioned on the third row of the third circuit board, corresponding to said lands or vias of the second circuit board, to which no circuit patterns on the second circuit board are connected, and are connected to all the lands or vias positioned on sixth and seventh rows of the third circuit board;

fourth to sixth circuit boards also comprising respective circuit patterns which are arranged in the same manner as the circuit patterns on said first to third circuit boards with the circuit patterns of the fourth circuit board connected to all the lands or vias positioned on the third circuit board;

the fourth circuit board having a plurality of said lands or vias arranged equidistantly in column and row directions to form an area array corresponding to an arrangement of electrodes of a second electronic part which is to be mounted on said fourth circuit board so that said electrodes are electrically connected to said respective lands or vias;

said fourth circuit board comprising said circuit patterns which are connected to all the lands or vias positioned on a first, outermost row of the area array of the fourth circuit board, and are connected to alternatively selected lands or vias positioned on second and third rows of the fourth circuit board;

the fifth circuit board having a plurality of said lands or vias arranged so as to correspond to said lands or vias of the fourth circuit board to which no circuit patterns on the fourth circuit board are connected;

said fifth circuit board comprising said circuit patterns which are connected to all the lands or vias positioned on the second row of the fifth circuit board, corresponding to said lands or vias of the fourth circuit board, to which no circuit patterns on the fourth circuit board are connected, and are connected to all the lands or vias positioned on forth and fifth rows of the fifth circuit board;

the sixth circuit board having a plurality of said lands or vias arranged so as to correspond to said lands or vias of the fifth circuit board to which no circuit patterns on the fifth circuit board are connected;

said sixth circuit board comprising said circuit patterns which are connected to all the lands or vias positioned on the third row of the sixth circuit board, corresponding to said lands or vias of the fifth circuit board, to which no circuit patterns on the fifth circuit board are connected, and are connected to all the lands or vias positioned on sixth and seventh rows of the sixth circuit board; and a seventh circuit board having a plurality of said lands or vias arranged so as to correspond to said lands or vias of the sixth circuit board to which no circuit patterns on the sixth circuit board are connected;

said seventh circuit board comprising said circuit patterns which are connected to all the lands or vias positioned on eighth and ninth rows of the sixth circuit board.

\* \* \* \* \*